(12) United States Patent
Ziesler et al.

(10) Patent No.: US 8,510,626 B2
(45) Date of Patent: Aug. 13, 2013

(54) DATA CODING APPARATUS AND METHODS

(75) Inventors: Sebastian Ziesler, Boston, MA (US); Aws Shallal, Durham, NC (US)

(73) Assignee: Cortina Systems, Inc., Sunnyvale, CA (US)

( * ) Notice: Subject to any disclaimer, the term of this patent is extended or adjusted under 35 U.S.C. 154(b) by 0 days.

(21) Appl. No.: 13/314,970

(22) Filed: Dec. 8, 2011

(65) Prior Publication Data
US 2012/0079347 A1  Mar. 29, 2012

Related U.S. Application Data

(63) Continuation of application No. 11/808,409, filed on Jun. 8, 2007, now Pat. No. 8,095,846.

(51) Int. Cl.
*H03M 13/00* (2006.01)
(52) U.S. Cl.
USPC .......................................... 714/758; 702/189
(58) Field of Classification Search
USPC .......................... 714/758; 702/189
See application file for complete search history.

(56) References Cited

U.S. PATENT DOCUMENTS

| 6,041,434 A * | 3/2000 | Kamishima .................. 714/807 |
| 6,820,228 B1 | 11/2004 | Keller |
| 2008/0163026 A1 | 7/2008 | Varnica et al. |

OTHER PUBLICATIONS

U.S. Office Action issued on U.S. Appl. No. 11/808,409 on Mar. 17, 2011, 12 pages.

* cited by examiner

*Primary Examiner* — Guy Lamarre (57) ABSTRACT

Data encoding apparatus and methods are disclosed. A Cyclic Redundancy Check (CRC) coding module is selected, from a plurality of different CRC coding modules, for coding a block of information. A generic coder, which is configurable to perform CRC coding based on any of the plurality of different CRC coding modules, is configured to perform CRC coding for the block of information based on the selected CRC coding module. A block of information for which a coding operation is to be performed may be segmented into a plurality of segments having respective lengths. Respective generic coders may be configured to perform the coding operation for the plurality of segments. In this case, a result of the coding operation for the block of information may be determined based on results of the coding operations for the plurality of data segments.

14 Claims, 10 Drawing Sheets

DATA CODING APPARATUS AND METHODS

CROSS-REFERENCE TO RELATED APPLICATION

This application is a continuation of U.S. patent application Ser. No. 11/808,409 filed on Jun. 8, 2007 now U.S. Pat. No. 8,095,846, the contents of which are incorporated in their entirety herein by reference.

FIELD OF THE INVENTION

The present invention relates generally to the field of communications, and in particular to coding of information such as data packets in a data stream.

BACKGROUND

In the transmission of frames or packets over communication channels, errors are frequently introduced into transmitted data. A known technique of error control is error detection, which involves detecting errors at a receiver. According to one type of scheme, a transmitter calculates a code for transmission data using an algorithm. The code is appended to the data and both the code and the data are transmitted to the receiver. The receiver calculates another code from received data using the same algorithm. If the codes do not match, then one or more errors have been introduced into the transmitted data during transmission.

One algorithm for error detection uses polynomials to generate Cyclic Redundancy Check (CRC) codes. A CRC code, also typically referred to as a CRC value or simply a CRC, is the remainder of the division of data by a polynomial, called a generator polynomial. CRC logic which generates a CRC may be implemented using hardware, such as exclusive-or (XOR) gates.

Prior to processing by CRC logic, a data block may be aligned so that the next bits to be processed are moved into correct position. After alignment, one of multiple physical implementations of CRC logic, for different data block lengths and/or CRC types, may be selected. Common types of CRCs are CRC-16, CRC-32, and CRC-64, which have different associated lengths of codes. Finally, the aligned data block is sent to the selected CRC logic implementation to generate a CRC.

Figure 1:
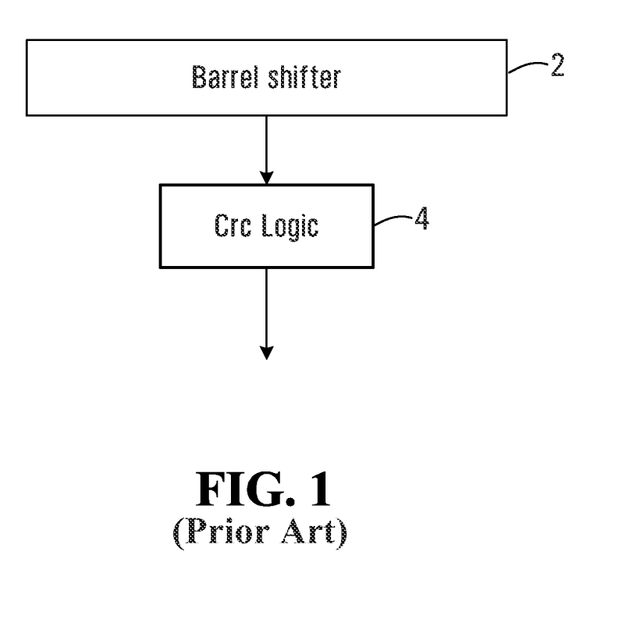
FIG. 1 is a block diagram of a conventional arrangement for generating CRCs.

FIG. 1 is a block diagram of a conventional arrangement for generating CRCs. In the example shown, a barrel shifter 2 aligns an unaligned received data packet. The aligned data packet is then supplied to CRC logic 4 to produce a CRC. A disadvantage of using the barrel shifter 2 to align a data packet is that common implementations of barrel shifters require many logic gates.

Figure 2:
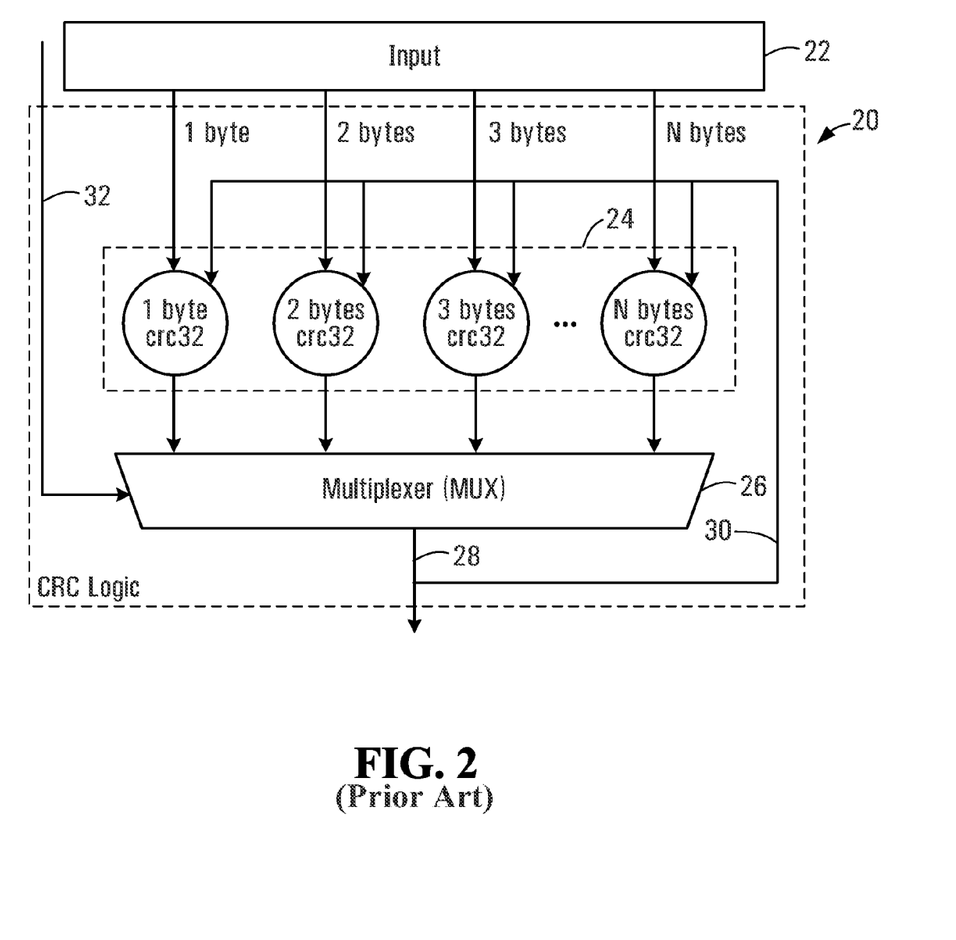
FIG. 2 is a block diagram of another conventional arrangement, for generating a CRC based on different lengths of data packets.

FIG. 2 is a block diagram of another conventional arrangement, which includes CRC logic for generating a CRC based on different lengths of data packets. The CRC logic 20 has multiple XOR planes, generally designated 24, for generating CRCs for each of different lengths of data packets. An input 22 is coupled to the XOR planes 24, which in turn are coupled to a multiplexer 26. An output 28 of the multiplexer 26 is fed back to the XOR planes 24 via a feedback path 30.

In operation, an aligned data word is received at the input 22 and supplied to the XOR planes 24. Each XOR plane 24 generates a CRC, and the CRC generated by one of the XOR planes is selected by the multiplexer 26, based on a desired length 32, to produce an output CRC at 28. FIG. 2 shows CRC-32 logic 20 having N XOR planes 24 for producing N CRCs for respective different lengths of data packets. The multiplexer 26 is thus an N-to-1 multiplexer that selects one (1) CRC from the N CRCs.

As such, multiple XOR planes 24 are required, specifically one XOR plane for each supported data packet length.

Figure 3:
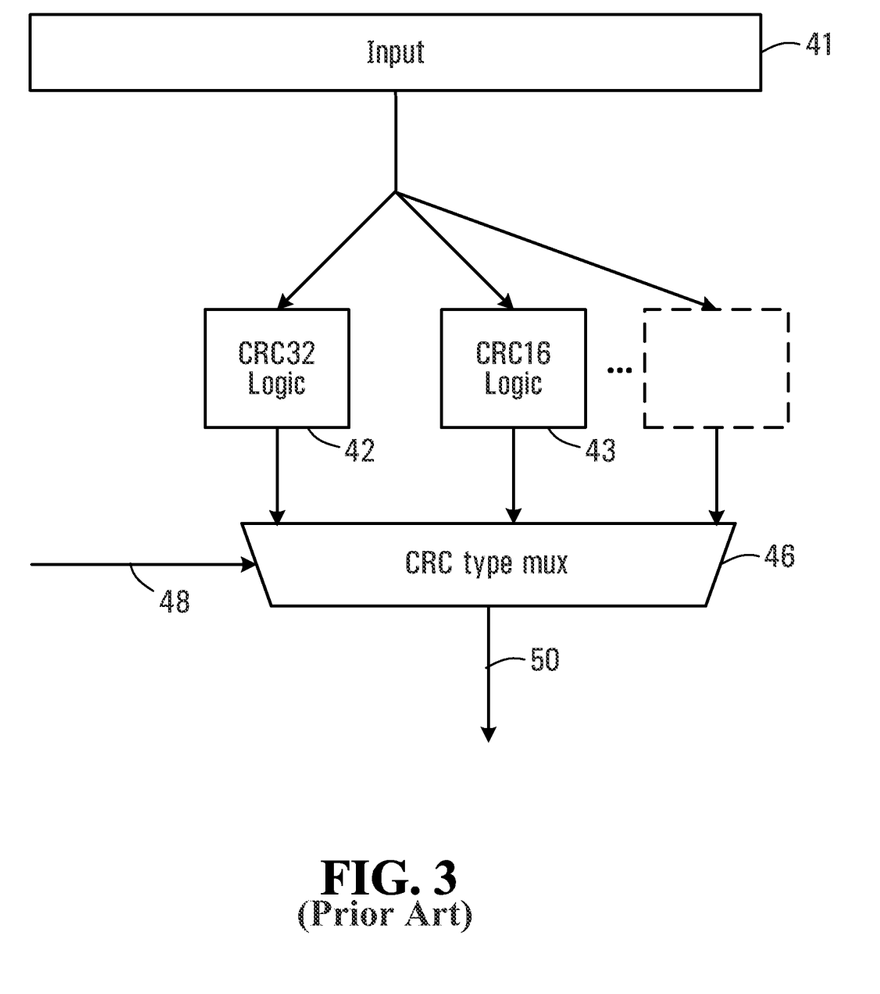
FIG. 3 is a block diagram of a further conventional arrangement, for generating CRCs of different types.

FIG. 3 is a block diagram of a conventional arrangement for generating CRCs of different types. An input 41 is coupled to CRC logic of different types, such as CRC-32 logic 42, CRC-16 logic 43, and so on. Each implementation of CRC logic is in turn coupled to a multiplexer 46. An aligned data word is received at the input 41 and supplied to the CRC logic implementations 42, 43 to produce CRCs of respective types. A CRC is selected by the multiplexer 46, based on a desired CRC type 48, to produce the CRC at an output 50. As such, multiple physical CRC logic implementations 42, 43 of different types are required.

Thus, conventional techniques tend to use a respective dedicated physical CRC implementation for each data block length and CRC type to be supported. As the number of supported packet lengths increases, so does the physical area required to accommodate coding components. The timing of such conventional techniques also slows down due to an increased number of code types being generated.

This type of architecture is also used in other types of coding, such as data scrambling for instance.

SUMMARY OF THE INVENTION

For the foregoing reasons, there is a need for a design which uses area and speed more efficiently.

According to one aspect of the invention, a method includes selecting, from a plurality of different CRC coding modules, a CRC coding module for coding a block of information, and configuring a generic coder to perform CRC coding for the block of information based on the selected CRC coding module, the generic coder being configurable to perform CRC coding based on any of the plurality of different CRC coding modules.

Each CRC coding module may include a data matrix specifying portions of the block of information to be included in the CRC coding, and a CRC matrix corresponding to a CRC generator polynomial.

The method may also involve the generic coder performing CRC coding for the block of information by multiplying an amount of information from the block of information with the data matrix of the selected CRC coding module to produce a data product, multiplying a previously generated CRC code with the CRC matrix of the selected CRC coding module to produce a CRC product, and combining the data product and the CRC product in an exclusive-OR operation to generate a CRC code.

Selecting may involve selecting a CRC coding module based on at least one of: an amount of information, from the information block, to be used to generate a CRC code, an alignment of the block of information within a data stream, and a particular CRC generator polynomial.

In some embodiments, the method further includes receiving the plurality of CRC coding modules from software.

If the plurality of CRC coding modules supports up to a maximum amount of information, from an information block, to be used to generate a CRC code during CRC coding, and up to a maximum size CRC generator polynomial, the data matrix of each CRC coding module of the plurality of CRC coding modules may have a size corresponding to the maximum amount of information, and the CRC matrix of each CRC coding module of the plurality of CRC coding modules may have a size corresponding to the maximum size CRC generator polynomial.

The method may also include segmenting the block of information into a plurality of segments having respective lengths, in which case selecting may involve selecting a respective CRC coding module for coding the plurality of segments, and configuring the generic coder may involve configuring respective generic coders to perform CRC coding for the plurality of segments based on the selected CRC coding modules.

An apparatus is provided in accordance with another aspect of the invention, and includes a selector operable to select, from a plurality of different CRC coding modules, a CRC coding module for coding a block of information, and a generic coder operatively coupled to the selector and operable to perform CRC coding based on any of the plurality of different CRC coding modules, the generic coder being configured by the selected CRC coding module to perform CRC coding for the block of information based on the selected CRC coding module.

As noted above, each CRC coding module may include a data matrix specifying portions of the block of information to be included in the CRC coding, and a CRC matrix corresponding to a CRC generator polynomial.

The generic coder may include a data multiplier operable to multiply an amount of information from the block of information with the data matrix of the selected CRC coding module to produce a data product, a CRC multiplier operable to multiply a previously generated CRC code with the CRC matrix of the selected CRC coding module to produce a CRC product, and an exclusive-OR gate operatively coupled to the data multiplier and to the CRC multiplier and operable to combine the data product and the CRC product to generate a CRC code.

The data multiplier has a pipelined structure in some embodiments.

The selector may select a CRC coding module based on at least one of: an amount of information, from the information block, to be used to generate a CRC code, an alignment of the block of information within a data stream, and a particular CRC generator polynomial.

The apparatus may also include a memory, operatively coupled to the selector, for storing the plurality of CRC coding modules.

In some embodiments, the generic coder is one of a plurality of generic coders operatively coupled to the selector, and the apparatus also includes a segmentor operatively coupled to the selector and to each generic coder of the plurality of generic coders, the segmentor being operable to segment the block of information into a plurality of segments having respective lengths. The selector may be further operable to select a respective CRC coding module for coding the plurality of segments, and the plurality of generic coders may be respectively configured by the selected CRC coding modules to perform CRC coding for the plurality of segments based on the selected CRC coding modules.

A computer-readable medium storing a data structure is also provided. The data structure includes CRC coding module information indicative of a plurality of CRC coding modules, and selection criterion information indicative of at least one selection criterion associated with each CRC coding module of the plurality of CRC coding modules. The CRC coding module information and the selection criterion information enable a CRC coding module of the plurality of CRC coding modules to be selected for configuring a generic coder to perform CRC coding for a block of information based on the selected CRC coding module.

The CRC coding module information may include the plurality of CRC coding modules.

In some embodiments, the selection criterion information associated with each CRC coding module of the plurality of CRC coding modules includes information indicative of at least one of: an amount of information, from an information block, to be used to generate a CRC code based on the CRC coding module, an alignment of a block of information within a data stream for which the CRC coding module may be used for CRC coding, and a particular CRC generator polynomial associated with the CRC coding module.

A method according to another aspect of the invention includes segmenting a block of information, for which a coding operation is to be performed, into a plurality of segments having respective lengths, configuring respective generic coders to perform the coding operation for the plurality of segments, the generic coders, when configured, performing the coding operation for the plurality of segments, and determining a result of the coding operation for the block of information based on results of the coding operations for the plurality of data segments.

Performing the coding operation may involve performing the coding operation for a segment based on the segment and on a result of the coding operation for a different segment.

The operation of segmenting may involve segmenting based on at least one of: a valid number of bits in the block of information and an alignment of the block of information in a data stream.

The coding operation may include a CRC coding operation or a scrambling operation, for example.

An apparatus is also provided, and includes a segmentor operable to segment a block of information, for which a coding operation is to be performed, into a plurality of segments having respective lengths, a plurality of generic coders operatively coupled to the segmentor and operable to perform the coding operation based on any of a plurality of different coding modules, the generic coders being configured by respective coding modules to perform the coding operation for respective segments of the plurality of segments, and an output section operatively coupled to the plurality of generic coders and operable to determine a result of the coding operation for the block of information based on results of the coding operations for the plurality of data segments.

The plurality of generic coders may include a generic coder operable to perform the coding operation for a segment based on the segment and on a result of the coding operation performed for a different segment by a different generic coder.

As noted above, the coding operation may include a CRC coding operation or a scrambling operation.

Other aspects and features of the present invention will become apparent to those ordinarily skilled in the art upon review of the following description of the specific embodiments of the invention.

BRIEF DESCRIPTION OF THE DRAWINGS

Examples of embodiments of the invention will now be described in greater detail with reference to the accompanying diagrams, in which.

DETAILED DESCRIPTION OF THE INVENTION

Figure 4:
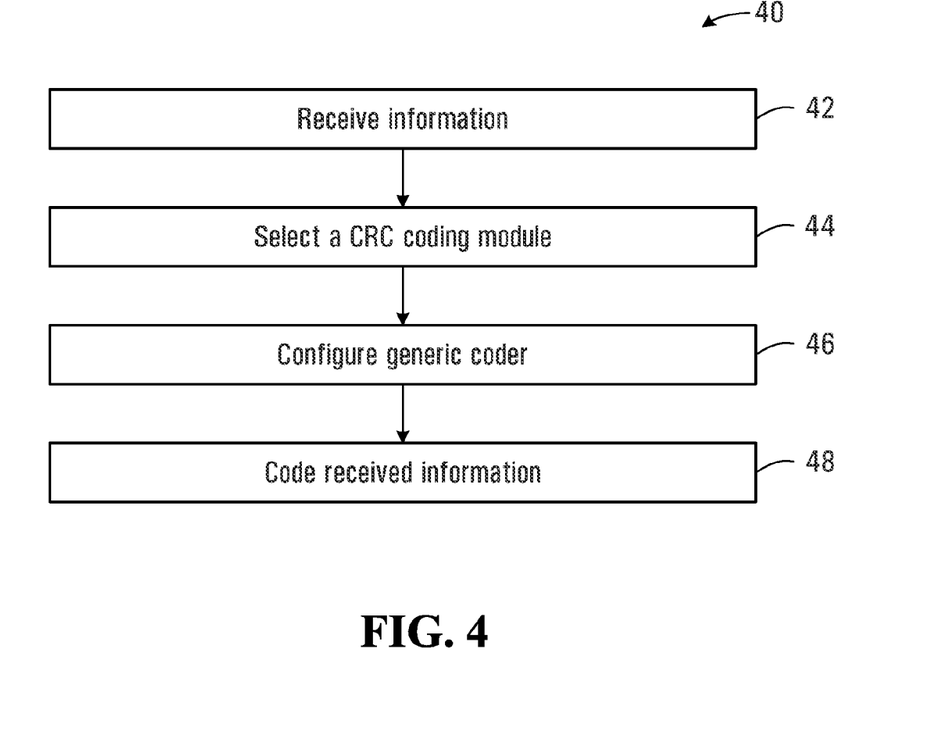
FIG. 4 is a flowchart of a method according to an aspect of the present invention.

FIG. 4 is a flowchart of a method 40 according to an aspect of the present invention. It should be appreciated that FIG. 4, as well as FIGS. 5 to 11, are intended solely for the purposes of illustration. The present invention is in no way limited to the specific embodiments shown in the drawings and explicitly described herein. Variations of those embodiments may be or become apparent to those skilled in the art.

In the method 40, information to be coded is received at 42. It should be noted that references made herein to "coding" data or information should not be interpreted as necessarily being associated with a source or sender of information. In the case of CRC coding, for example, a CRC is generated at both a transmitter and at a receiver. Thus, coding is intended to convey the notion of generating processed information in the form of a code, based on information to be coded.

At 44, a coding module, illustratively a CRC coding module, is selected from a plurality of different coding modules. The coding module selected at 44 is to be used for coding a block of the received information, which may be a packet, for example.

A generic coder is configured at 46 to perform coding for the block of information based on the selected coding module. As described in further detail below, the generic coder is configurable to perform coding based on any of the plurality of different coding modules. The generic coder, once configured, may then code the received information as shown at 48.

Thus, a single generic coder can be used to implement any of a plurality of different types of coding. In one embodiment, each coding module is a CRC coding module that includes a data matrix specifying portions of the block of information to be included in the CRC coding, and a CRC matrix corresponding to a CRC generator polynomial. The operation of the generic coder is thereby "constrained" by providing the particular selected matrices to the coder. Although embodiments of the invention are described herein primarily with reference to matrices, it should be appreciated that coding modules may be provided in other forms, as arrays for instance.

Figure 5:
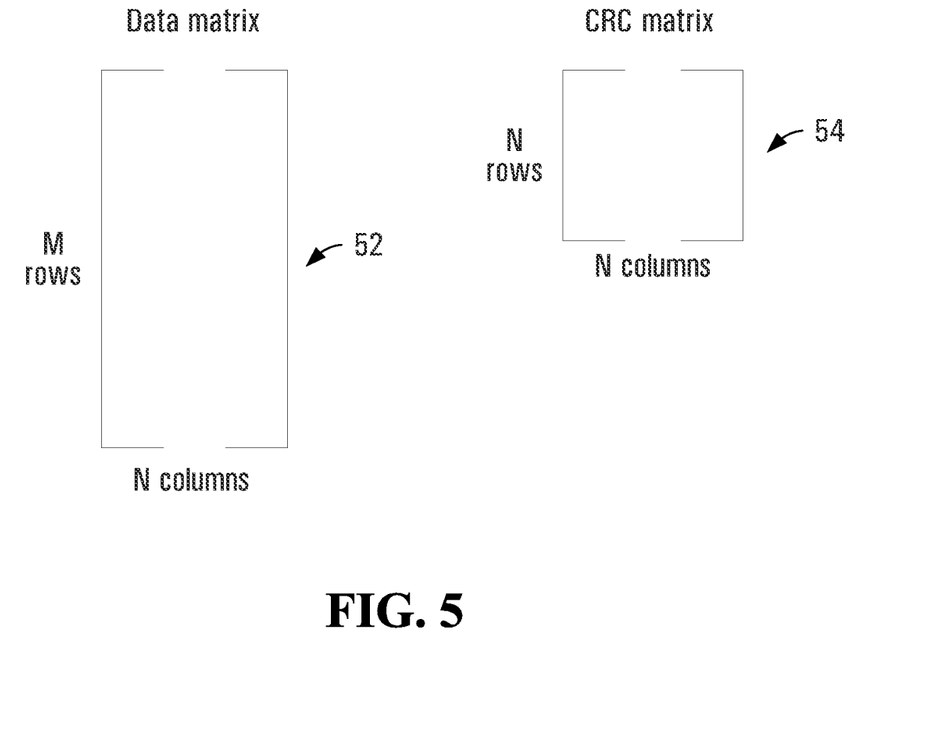
FIG. 5 is a representation of a data matrix and a CRC matrix used in one embodiment of the invention.

FIG. 5 is a representation of a data matrix 52 and a CRC matrix 54 used in one embodiment of the invention. These matrices may be loaded by a generic coder or otherwise used to configure a generic coder at 46 (FIG. 4).

According to one particular embodiment, each element (not shown) of the matrices 52, 54 is a bit having a value of '0' or '1'. The data matrix 52 contains bits for selecting particular bits of a data packet or some other block of information to be included in a CRC coding operation, while the CRC matrix 54 contains bits representing a CRC generator polynomial.

The dimensions of the matrices 52, 54 may be related to an amount M of information that is to be used to generate each CRC code during a CRC coding operation, which may but need not necessarily be the length of a data packet or other block of information, and the length N of a CRC generator polynomial. For example, the data matrix 52 may have M rows and N columns, and the CRC matrix 54 may have N rows and N columns, as shown.

Consider an example in which a packet having a length of 10 bytes (M=80 bits) is to be coded with CRC-32. The data matrix 52 might then be 80 bits by 32 bits, and the CRC matrix 54 might be 32 bits by 32 bits.

As noted above, the data matrix 52 may include bits having values of '0' or '1' to effectively select portions of information that are to be included in a coding operation. The CRC matrix 54, however, corresponds to a CRC generator polynomial. For the CRC generator polynomial $x^7+x^3+1$, for example, the 7 by 7 CRC matrix 54 for coding 8 bits of data, in one embodiment, would be $$\begin{bmatrix} 1 & 1 & 0 & 0 & 1 & 0 & 0 \\ 0 & 1 & 1 & 0 & 0 & 1 & 0 \\ 0 & 0 & 1 & 1 & 0 & 0 & 1 \\ 0 & 0 & 0 & 1 & 1 & 0 & 0 \\ 0 & 1 & 0 & 0 & 0 & 1 & 0 \\ 0 & 0 & 1 & 0 & 0 & 0 & 1 \\ 1 & 0 & 0 & 1 & 0 & 0 & 0 \end{bmatrix},$$

and the CRC matrix 54 for coding 16 bits of data, in another embodiments, would be $$\begin{bmatrix} 1 & 1 & 1 & 0 & 1 & 0 & 0 \\ 0 & 1 & 1 & 1 & 0 & 1 & 0 \\ 1 & 0 & 1 & 1 & 1 & 0 & 1 \\ 0 & 1 & 0 & 1 & 1 & 1 & 0 \\ 0 & 1 & 0 & 0 & 0 & 1 & 1 \\ 1 & 0 & 1 & 0 & 0 & 0 & 1 \\ 1 & 1 & 0 & 1 & 0 & 0 & 0 \end{bmatrix}.$$

A complete set of different data/CRC matrix pairs may be generated using a software script, for example. According to one embodiment, a script generates matrix pairs by performing M iterations of a serial representation of a CRC algorithm, where M is the number of bits to be coded. A CRC or scrambling operation can be viewed as a serial shift register with feedback taps. In each of a number of iterations, the register is shifted by one, and one new code bit is produced. A script may be used to perform this computation in software M times, capturing and then outputting the results in the form of the matrices. A single number M, along with a specific packet data alignment and CRC type, gives one M by N data matrix and one N by N CRC matrix. Where byte aligned data packets are to be encoded, such a script might perform 8 iterations of the basis CRC shift register for M=8 and output the corresponding matrices. The script can then be re-run for M=16, M=24, etc., up to a maximum data block size, which is M=256 (32 bytes) in one embodiment.

The generated matrices may be encoded directly into logic (i.e., hard-coded), stored in a memory or otherwise made available for selection during coding. A set of matrices may be generated based on desired selection parameters or criteria, such as one or more of: an amount of information (M) to be used to generate a CRC code, an alignment of a packet or other block of information within a data stream, and a particular CRC generator polynomial.

Each different selection criterion, or each different set of multiple criteria where more than one criterion is to be used in selecting a coding module, is associated with a respective matrix pair. For example, for choices of data lengths ranging from 1 to 8 bytes, CRC types CRC-32 and CRC-16, and alignments of 4 and 8 byte aligned, there are 8*2*2=32 matrix pairs.

The above examples and other examples provided herein are intended solely for the purposes of illustration, and not to limit the scope of the present invention in any way. In the foregoing example, different matrices could be used for different alignments of a data packet, such as 20 bytes aligned [255:96] or 20 bytes aligned [167:8] within a 32 byte word, for instance. Other variations of this example and other examples may be or become apparent to those skilled in the art.

In some embodiments, the CRC coding modules support up to a maximum amount of information (M_max) to be used to generate a CRC code during CRC coding, and up to a maximum size (N_max) CRC generator polynomial. The data matrix 52 (FIG. 5) of each CRC coding module may then have a size corresponding to the maximum amount of information, and the CRC matrix 54 of each CRC coding module may have a size corresponding to the maximum size CRC generator polynomial. In this case, the matrices may be padded with zeroes as appropriate to the maximum sizes supported. Thus, data matrices that are smaller than M_max by N_max are padded to M_max by N_max, and CRC matrices that are smaller than N_max by N_max are padded to N_max by N_max.

Figure 6:
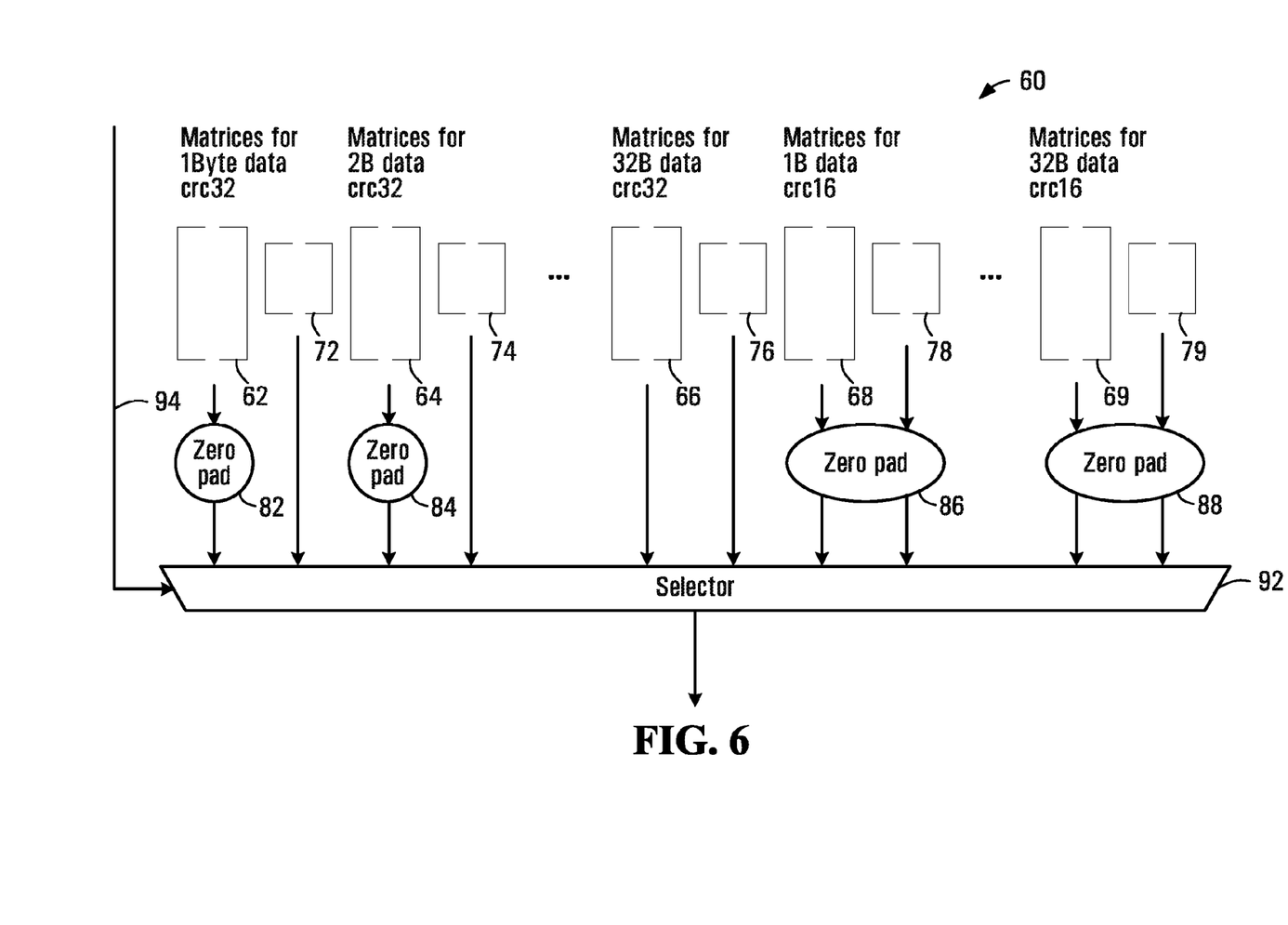
FIG. 6 is a representation of zero padding of matrices.

FIG. 6 is a representation of zero padding of matrices. In the representation 60, some of the data matrices 62, 64, 66, 68, 69 and some of the CRC matrices 72, 74, 76, 78, 79 are padded, as shown at 82, 84, 86, 88. In this example, the maximum data length is 32 bytes, and accordingly the smaller data matrices 62, 64, 68 are zero padded to 256 rows. For a given maximum of N_max=32 CRC bits in this example, the CRC-16 matrices 78, 79 are zero padded to 32 bits by 32 bits. Where a CRC matrix is padded, the corresponding data matrix of that matrix pair is column padded. In the case of each of the matrix pairs 68/78, 69/79, the CRC matrices 78, 79 are zero padded to 32 bits by 32 bits, and thus the data matrices 68, 69 would be zero padded to 32 columns. It will be apparent that no padding is needed for maximum sized data and CRC matrices, such as the data matrix 66 and CRC matrices 72, 74, 76.

FIG. 6 also shows a selector 92 for selecting a matrix pair. The selector 92 may be a multiplexer in some embodiments. A matrix pair is selected based on one or more selection parameters or criteria received at 94. Illustrative examples of selection parameters or criteria have been described above.

In one embodiment, the various matrices and values in the matrices are hard-wired into source code that is used to generate logic gates. When a synthesis operation is executed on the source code, all of the coding logic illustrated by the matrices in FIG. 6 is reduced to a sum-of-products (and-or) logic representation. This can be advantageous in terms of the number of logic gates, due to the sparse nature of the matrices, and in particular the zero padded matrices.

Referring again to FIG. 4, the encoding of received information at 48 may involve data multiplication, CRC multiplication, and exclusive-OR processing. For example, a generic coder that has been configured with a data matrix and a CRC matrix may encode a block of information by multiplying an amount (M) of information with the data matrix of the selected CRC coding module to produce a data product, multiplying a previously generated CRC code with the CRC matrix of the selected CRC coding module to produce a CRC product, and combining the data product and the CRC product in an exclusive-OR operation to generate a CRC code. This CRC code could then be fed back for use in generating a CRC code for a following information block in a data stream.

Figure 7:
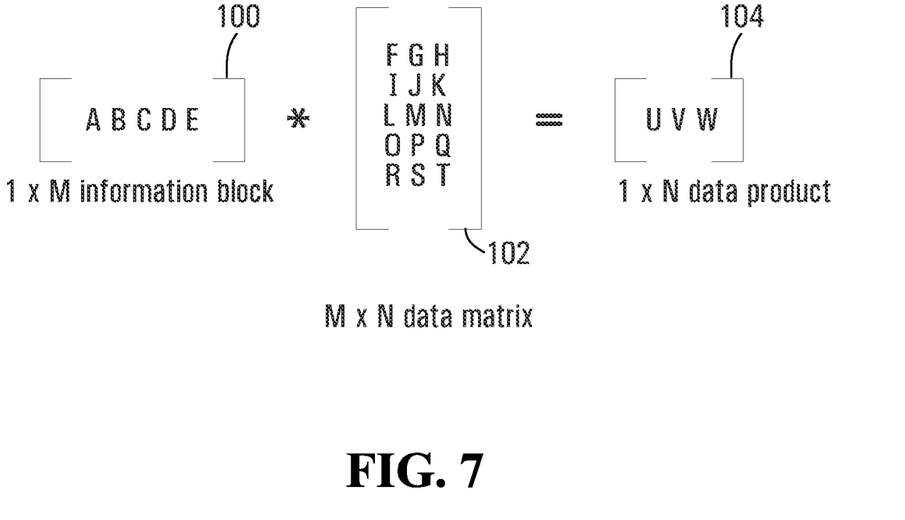
FIG. 7 is a representation of multiplication between data and a data matrix.

FIG. 7 is a representation of such a multiplication between data and a data matrix. In the example shown, an information block 100 of length M=5 is multiplied with the 5 by 3 data matrix 102 to produce a data product 104. The information block 100 is arranged in a 1 by 5 vector and consists of a string of bits represented by A, B, C, D, E. The data matrix 102 contains bits represented by F through T. In the data product 104, which is a 1 by 3 vector, the bits U, V, W have the following values:

$$U=A*F+B*I+C*L+D*O+E*R;$$

$$V=A*G+B*J+C*M+D*P+E*S;$$

$$W=A*H+B*K+C*N+D*Q+E*T,$$

where "*" denotes an AND operation and "+" denotes an XOR operation.

Although not explicitly shown in FIG. 7, CRC matrix multiplication proceeds in a similar manner. A previously generated 1 by N CRC, or an initial 1 by N vector such as an all '1's vector if a CRC has not yet been calculated, is multiplied with the CRC matrix of the selected CRC coding module to produce a CRC product.

The multiplication of matrices may be implemented using AND gates and an XOR gate. For example, this may be implemented by bitwise ANDing data with each row of the data matrix 100 (or bitwise ANDing the previously generated CRC with the CRC matrix), and then XORing all resulting bits in a row.

Coding techniques according to embodiments of the invention may be implemented, for example, in an apparatus that includes a selector that is operable to select, from a plurality of different CRC coding modules, a CRC coding module for coding a block of information, and a generic coder operatively coupled to the selector. The generic coder is operable to perform CRC coding based on any of the plurality of different CRC coding modules, and is configured by the selected CRC coding module to perform CRC coding for the block of information based on the selected CRC coding module.

Figure 8:
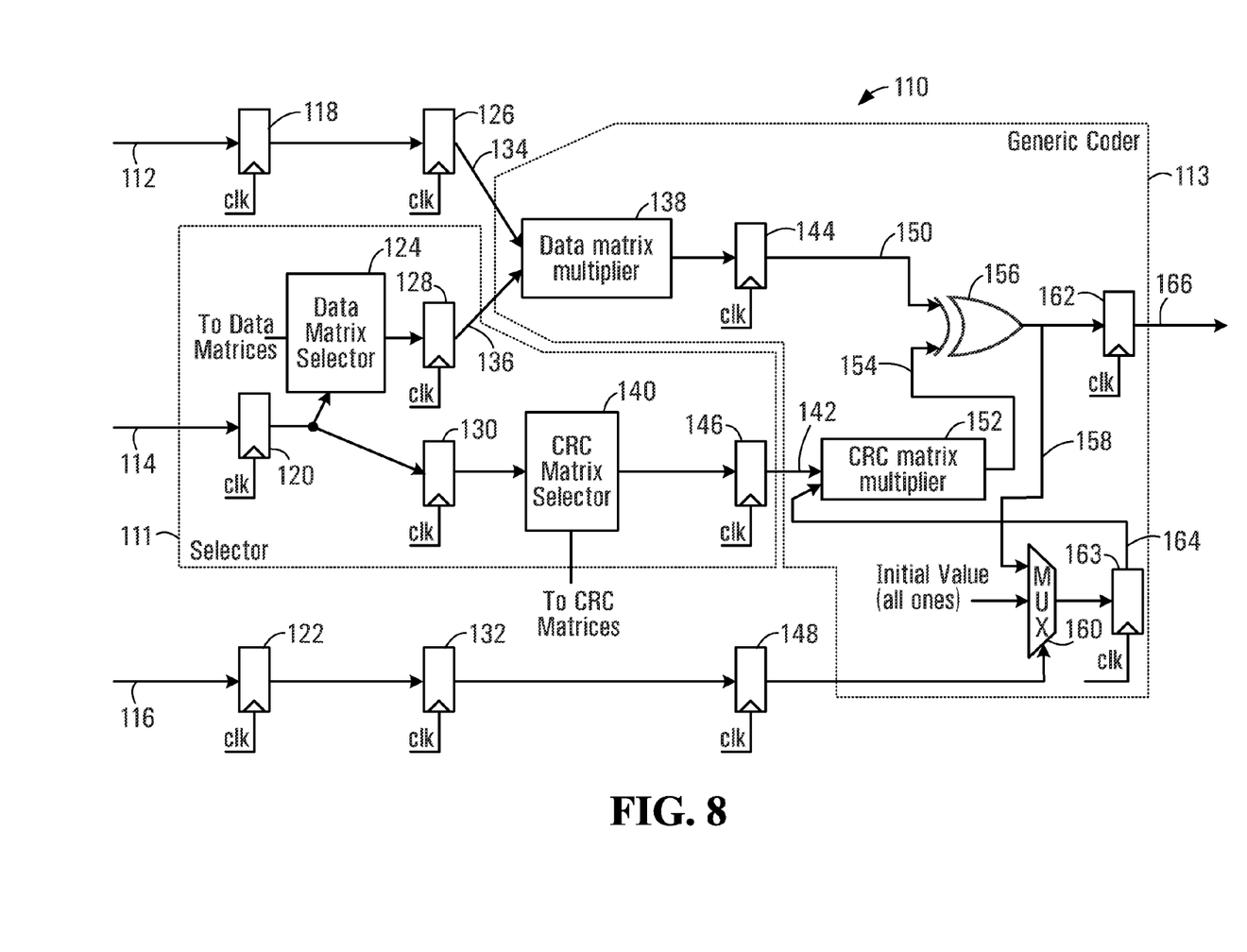
FIG. 8 is a block diagram of an example apparatus according to an embodiment of the invention.

FIG. 8 is a block diagram of an example of such an apparatus according to an embodiment of the invention. The apparatus 110 has inputs 112, 114, 116, a data matrix selector 124, a data matrix multiplier 138, a CRC matrix selector 140, a CRC matrix multiplier 152, an XOR gate 156, a multiplexer 160, and an output 166. Various storage elements 118, 120, 122, 126, 128, 130, 132, 144, 146, 148, 162, 163 are also shown.

Any of various forms of connections and elements may be used to implement the apparatus 110. The storage elements provide delays to ensure correct timing of the operations performed in the apparatus 110, and may be implemented using flip-flops, for example. A multiplexer is one example of an element that may be used as a selector 124, 140. The multipliers 138, 152 may be implemented using AND and XOR gates, as noted above. Other implementations may be or become apparent to those skilled in the art.

The input 112 is an input for receiving information to be encoded, and is operatively coupled to the data matrix multiplier 138 through the storage elements 118, 126. The input 114 is an input through which selection parameters, or in some embodiments a selection command or instruction, are received, and is operatively coupled through the storage element 120 to the data matrix selector 124, which in turn is operatively coupled to the data matrix multiplier 138 through the storage element 128. The data matrix multiplier 138 is operatively coupled to the XOR gate 156 through the storage element 144. The input 114 is also operatively coupled through the storage element 130 to the CRC matrix selector 140, which is operatively coupled through the storage element 146 to the CRC matrix multiplier 152. The CRC matrix multiplier 152 is operatively coupled to the XOR gate 156. The output of the XOR gate 156 is operatively coupled to the apparatus output 166 through the storage element 162, and is also operatively coupled to an input of the CRC matrix multiplier 152 through a feedback path that includes connections 158, 164, the multiplexer 160, and the storage element 163.

FIG. 8 also indicates elements that may be provided to implement a selector 111 and a generic encoder 113 in some embodiments.

In operation, data and CRC matrices are generated and provided to the data matrix selector 124 and the CRC matrix selector 140, respectively. As shown, the selectors 124, 140 may be operatively coupled to a memory (not shown) in which the matrices are stored, to a software script that generates the matrices, and/or to hard-coded values. A script might be run when originally writing source code, such that the actual matrices are hard-coded into the design. It should also be noted that a script or other computer program is not required to generate matrices. These could be manually generated and stored in a memory or hard-coded into a design, for example. Another possible variation would be to generate the matrix pair for selected coding "on the fly", by software for instance. The data matrix selector 124 and the CRC matrix selector 140 could be operatively coupled to a matrix generation component, which generates data and CRC matrices when matrix selections are made.

Information to be coded, illustratively a data packet, and selection parameters or criteria are received at the inputs 112 and 114, respectively. The information to be coded is provided by an information source, such as an application running at a communication device, and selection criteria may be extracted from the received information, such as from a packet header, manually input by a user, or otherwise determined.

The data matrix selector 124 selects a data matrix based on the selection criterion or criteria received at the input 114, and receives or otherwise obtains, through a memory access operation for instance, the selected data matrix. As will be apparent from the foregoing description of various matrix generation options, the data matrix selector 124 might receive or be hard-coded with a plurality of data matrices and then select one of those data matrices, or select a data matrix and then obtain the selected data matrix from a memory or a matrix generation component.

The selected data matrix is provided to the data matrix multiplier 138 on the connection 136. The data matrix multiplier 138 multiplies the selected data matrix with the information it receives at 134 from the input 112 and the storage elements 118, 126 to produce a data product.

The CRC matrix selector 140 similarly selects a CRC matrix based on the selection criterion or criteria received at the input 114, and receives or otherwise obtains the selected CRC matrix. The CRC matrix selector 140 might receive or be hard-coded with a plurality of CRC matrices and then select one of those CRC matrices, or select a CRC matrix and then obtain the selected CRC matrix from a memory or a matrix generation component.

The selected CRC matrix is provided to an input 142 of the CRC matrix multiplier 152 through the storage element 146. The CRC matrix multiplier 152 multiplies the selected CRC matrix with a feedback input received from a feedback path at 164 to produce a CRC product at its output 154. If a CRC has been previously generated, then the feedback input is the previously generated CRC. However, if no CRC has been previously generated, then the feedback input may be an all '1's vector or some other initial or default value.

Data and CRC products generated by the data matrix multiplier 138 and the CRC matrix multiplier 152 are provided at 150, 154 to the XOR gate 156, which combines the products in an XOR operation. The resultant CRC code may be output from the apparatus 110 through the storage element 162 at 166 when a complete information block has been processed, and otherwise is fed back to the CRC matrix multiplier 152 as the feedback input via the feedback path connection 158.

In the feedback path, the multiplexer 160 is controlled so as provide either a previously generated CRC from the XOR gate 156 or an initial or default input to the CRC matrix multiplier 152 through the storage element 163 as the feedback input. The multiplexer 160 receives the output of the XOR gate 156 and an initial value, from a stream of identity values in the example shown. It selects between these inputs based on whether or not it receives an end of packet flag or other signal indicating the end of a block of information from the input 116 through the storage elements 122, 132, 148. The feedback input to the CRC matrix multiplier 152 thus consists of the initial value immediately after a current block of information being coded ends (i.e., a next block is to be coded), and otherwise is a previously generated CRC.

Each piece of length M of a data packet or information block is processed through the apparatus 110 as described above. Once an entire data packet or block has been processed, a final CRC is output at 166. The output at 166 might also be enable by an end of packet flag or an analogous signal indicating the end of an information block being coded.

The timing of the above steps may be varied to meet timing needs. As will be apparent from FIG. 8, this may be implemented using hardware, such as delay flip-flops coupled to a clock, or using software, such as timing scripts.

In some embodiments, the data matrix multiplier 138 is pipelined into a number of stages. As described above, a feedback input is multiplied with a selected CRC matrix to produce a CRC product, which is supplied together with a data product to the XOR gate 156. As such, the processing speed along this path may depend on the width of a bus at the input 112. A pipelined data matrix multiplier between the second and third columns of storage elements (126, 144) may allow for constant speed regardless of the width of the bus of the data stream. Since there is no feedback to this stage of the apparatus 110, the addition of a pipelined data matrix multiplier does not impact the overall final CRC result generated at 166.

The example apparatus 110 processes a CRC polynomial along a logical path including the CRC matrix multiplier 152, the XOR gate 156, and the multiplexer 160. The CRC matrix multiplier 152 may be implemented, for example, using an AND gate together with XOR gates, with the total number of XOR gates being $(N-1)^2$. This represents a lower gate count than conventional techniques. Also, the number of levels of logic through which a signal travels during coding is one 2-input AND gate plus $\log_2 N$ 2-input XOR gates.

Figure 9:
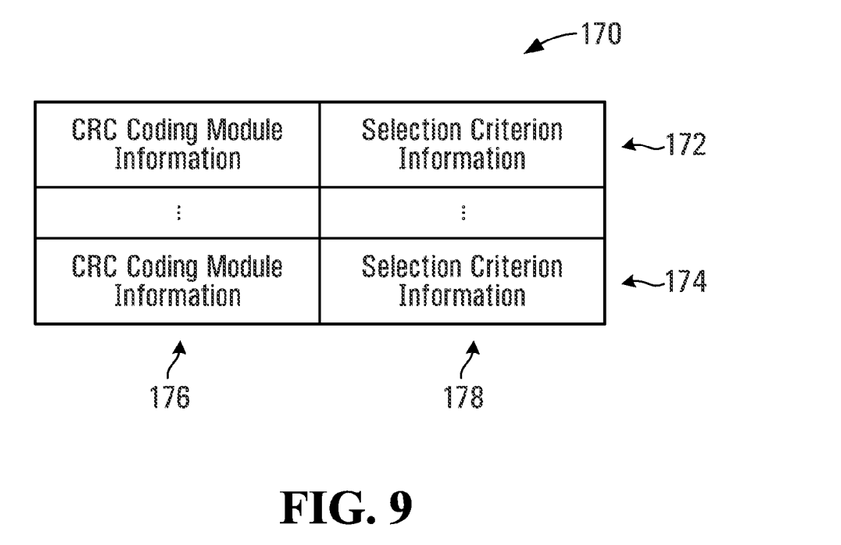
FIG. 9 is a block diagram of a data structure according to an embodiment of the invention.

FIG. 9 is a block diagram of a data structure according to an embodiment of the invention. The data structure 170 might be stored, for example, in one or more memory devices operatively coupled to the data matrix selector 124 and the CRC matrix selector 140 (FIG. 8). Although solid state memory devices are common in electronic systems, memory devices for use with movable or even removable storage media may be used to store the data structure 170.

The data structure 170 includes separate respective records 172, 174 for each of a plurality of CRC coding modules. Each record 172, 174 includes CRC coding module information 176 indicative of a CRC coding module and selection criterion information 178 indicative of at least one selection criterion associated with each CRC coding module. The CRC coding module information 176 and the selection criterion information 178 enable a CRC coding module to be selected for configuring a generic coder to perform CRC coding for a block of information based on the selected CRC coding module.

In some embodiments, the CRC coding module information 176 includes the actual CRC coding modules, in the form of matrices for instance. Addresses or pointers that may be used to access CRC coding modules may be stored as the CRC coding module information in other embodiments.

Examples of selection criteria for which selection criterion information 178 may be stored in the data structure 170 have been provided above. Thus, the selection criterion information 178 associated with each CRC coding module may include information indicative of at least one of: an amount of information, from an information block, to be used to generate a CRC code based on the CRC coding module, an alignment of a block of information within a data stream for which the CRC coding module may be used for CRC coding, and a particular CRC generator polynomial associated with the CRC coding module.

In the example data structure 170, associations between CRC coding modules and selection criteria are inherent in the relative locations of the CRC coding information 176 and the selection criterion information 178. Explicit associations are also possible, in which CRC coding modules and selection criteria are linked through pointers or other mapping information.

Figure 10:
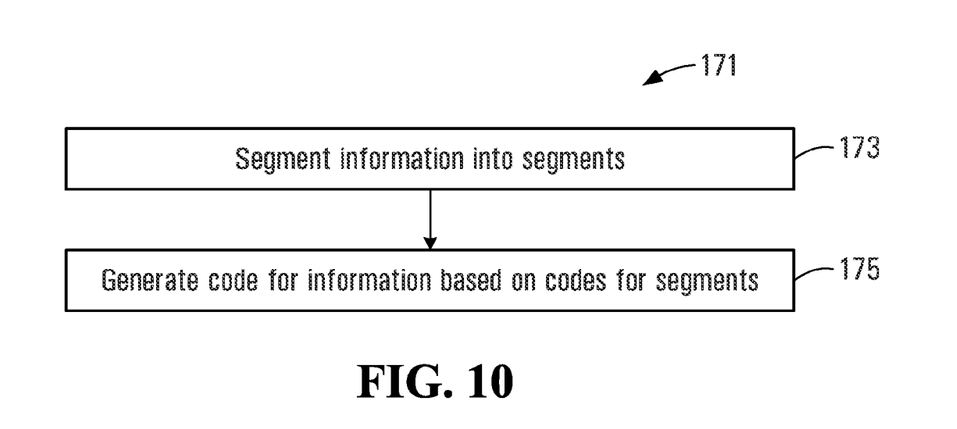
FIG. 10 is a flow diagram of a method according to another aspect of the present invention.

According to another aspect of the present invention, generic coders are used to respectively code segmented portions of a block of information. FIG. 10 is a flow diagram of such a method according to another aspect of the present invention.

The method 171 includes an operation 173 of segmenting a block of information, for which a coding operation is to be performed, into a plurality of segments having respective lengths. A code for the entire block of information is then generated at 175 based on the codes for the segments. This may involve configuring respective generic coders to perform the coding operation for the segments. A result of the coding operation for the block of information can then be determined based on results of the coding operations for the data segments.

As above, the generic coders may be arranged, for example, to be configured using matrices, arrays, or the like. They may also be implemented as exclusive-OR planes, as discussed in further detail below with reference to FIG. 11.

In some embodiments, generic coders are connected in a so-called "daisychain", such that the coding operation for one segment is based on the segment itself and on a result of the coding operation for a different segment.

An information block may be segmented into segments of any of various lengths. Segment lengths may be based, for example, on at least one of: a valid number of bits in the block of information and an alignment of the block of information in a data stream.

This type of technique might be applied in a CRC coding operation, a scrambling operation, or both. In the case of a CRC operation, multiple generic coders might be provided and configured using different CRC coding modules to perform CRC coding for different segments of a block of information.

More generally, an apparatus for implementing such a technique may include a segmentor that is operable to segment a block of information, for which a coding operation is to be performed, into a plurality of segments having respective lengths, a plurality of generic coders operatively coupled to the segmentor and operable to perform CRC coding based on any of a plurality of different CRC coding modules, and an output section operatively coupled to the plurality of generic coders and operable to determine a result of the coding operation for the block of information based on results of the coding operations for the plurality of data segments. The generic coders are configured by respective coding modules to perform the coding operation for the plurality of segments.

Figure 11:
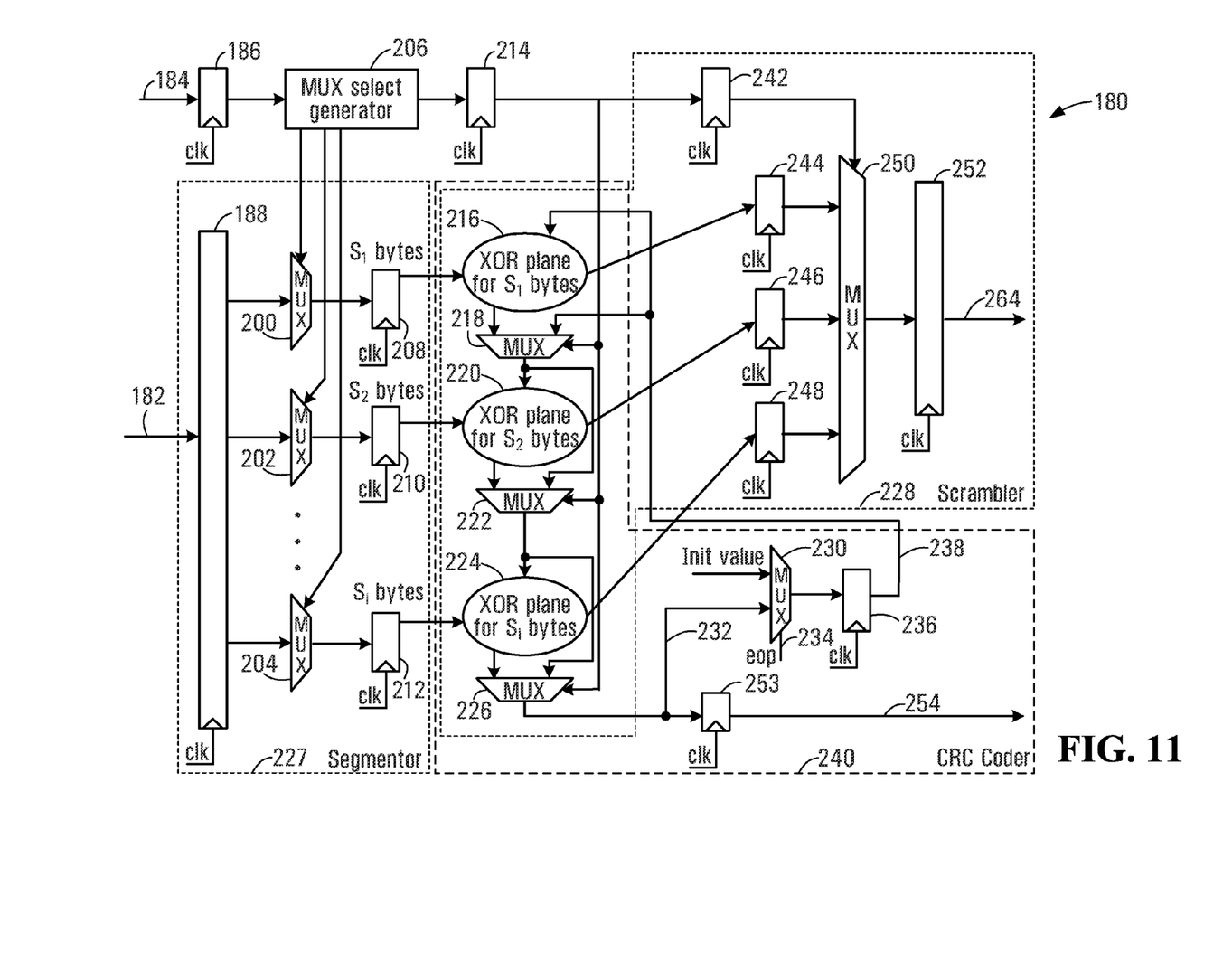
FIG. 11 is a block diagram of an apparatus according to a further embodiment of the invention.

FIG. 11 is a block diagram of such an apparatus according to a further embodiment of the invention, in which a segmented processing approach is implemented using XOR planes.

The apparatus 180 has an input 182 for receiving information to be coded, an input 184, a multiplexer select generator 206 operatively coupled to the input 184 through a storage element 186, multiplexers 200, 202, 204 operatively coupled to the input 182 through the storage element 188, XOR planes 216, 220, 224 respectively operatively coupled to the multiplexers 200, 202, 204 through storage elements 208, 210, 212 and to each other through the multiplexers 218, 222, 226, a multiplexer 250 operatively coupled to the multiplexer select generator through the storage elements 214, 242 and to the XOR planes through the storage elements 244, 246, 248, an output storage element 252 operatively coupled to the multiplexer 250 and to an output 264 of a scrambler 228, a multiplexer 230 operatively coupled in a feedback path to the XOR plane 216 and the multiplexer 218, through the connections 232, 238 and the storage element 236, from the multiplexer 226. A storage element 253 is also operatively coupled to the multiplexer 226 and to an output 254 of a CRC coder 240.

This apparatus 180 may be adapted for use as a CRC generator by configuring the XOR planes 216, 220, 224 to implement CRC logic and controlling other components of the CRC coder 240 to feed back previous CRC results to produce a final CRC at the output 254. The same apparatus 180 could also or instead be adapted for use as a scrambler by configuring the XOR planes 216, 220, 224 to implement scrambler logic and controlling other components of the scrambler 228 to produce scrambled data at the output 264.

As shown, many of the components of the apparatus 180 may be used for a scrambling operation, a CRC coding operation, or possibly both. Although it is expected that a single implementation of an apparatus would provide only a scrambler 228 or only a CRC coder 240, it is possible to provide both functions with one apparatus.

The apparatus 180 has a set S of XOR planes 216, 220, 224 operatively coupled to the multiplexers 200, 202, 204. The multiplexers 200, 202, 204 represent one implementation of a segmentor 227 for segmenting a block of information, such as a data packet, into segments having respective lengths of $S_1$, $S_2$, ..., $S_i$ bytes. Each XOR plane 216, 220, 224 is capable of processing a segment having a specific length. The XOR planes are an example of generic coders that can be configured to process segments of any of various lengths. Thus, the XOR planes 216, 220, 224 could be configured using matrices, substantially as described above, to implement processing for any of multiple different data segment lengths.

The set S might be selected so as to allow for processing of a block of information of any length from 1 to L, where L is the maximum number of bytes supported. In general, L will be the sum of the lengths of all of the XOR planes 216, 220, 224. Any of a number of arrangements of planes within a set are possible. For example, to support processing of data packets having lengths of up to L=32 bytes, the set S might contain six planes for respectively processing 32, 16, 8, 4, 2, and 1 bytes, or 16, 8, 4, 2, 1 and 1 bytes.

An algorithm could be used to select the arrangement of planes within the set. For example, the set S might include $S_L$, $S_{L/2}$, $S_{L/4}$, and so on up to $S_1$. If a particular quotient is not an integer, then the quotient could be rounded down, and the set S may include an additional S(1). In the above example, one set S that supports up to L=32 bytes is S={$S_{32}$, $S_{16}$, $S_8$, $S_4$, $S_2$, $S_1$}. As such, the set S includes six XOR planes, each of which is adapted to process one of 32, 16, 8, 4, 2, or 1 bytes.

In the apparatus 180, the multiplexers 218, 222, 226 allow each of the XOR planes 216, 220, 224 to receive as its input either a feedback input for CRC coding operations or an output of the previous XOR plane. The multiplexers 222, 224, can thus be used to connect the XOR planes 216, 220, 224 in a daisychain, such that an input of one XOR plane is either an output of the previous plane or the input of the previous plane. This daisychain may be implemented in other ways in different embodiments, to bypass or not bypass the previous plane's output.

In operation, information to be coded is received at the input 182, from a data bus for instance. Any or all of the multiplexers 200, 202, 204 are selected by a select signal generated by the MUX select generator 206. The MUX select generator 206 receives selection criteria and/or other control information from a user or packet header, for example, on the input 184 through the storage element 186, and generates selection signals for the appropriate multiplexer(s) 200, 202, 204.

The multiplexers 200, 202, 204 segment received information into segments, based on the number of valid bytes and the alignment of a first received valid byte for instance. For example, a packet data bus at the input 182 might physically contain enough bits for 32 bytes (256 bits). Of these possible 32 bytes, a number of valid bytes, which may be 32 bytes or less, might be considered part of a packet and be used to compute a CRC.

Supposing that L=32 bytes, the set S={32, 16, 8, 4, 2, 1}, and 17 valid bytes starting at 255:248 on a data bus (not shown) to which the input 182 is operatively coupled, the multiplexers 200, 202, 204 may segment the data packet into a 16-byte segment, data_bus[255:128], and a 1-byte segment, data_bus[127:120]. This multiplexing can be pipelined to accommodate timing needs. The XOR planes 216, 220, 224 receive the segments through the storage elements 208, 210, 212, and produce respective outputs.

In a case where the apparatus 180 is adapted for use as a scrambler, respective outputs from the XOR planes 216, 220, 224 are provided to the multiplexer 250 through the storage elements 244, 246, 248. The multiplexer 250 combines the respective outputs to produce an overall coding result for the received data block or packet at 264, and may thus be considered an example of a scrambler output section. Timing of the output at 264 is controlled by the multiplexer select generator 206. For a scrambler implementation, this output may be multiplexed, as scrambled data, back onto a data bus or other medium from which information was received for coding. This multiplexing can also be pipelined to accommodate timing needs.

In some embodiments, the XOR planes 216, 220, 224 are used to implement CRC logic by configuring the planes with data and CRC matrices as described above. Each XOR plane then has a data matrix for multiplication with a portion of a data stream and a CRC matrix for multiplication with a feedback input. For each data segment, data and CRC multiplications are performed, and the resulting data and CRC products are supplied to an XOR gate to generate a CRC for the data segment. The CRCs for the data segments are summed, or may be otherwise combined, to generate a final CRC. The generated CRC for each segment is fed into the logic for the next segment in the apparatus 180, to thereby combine the CRCs of multiple segments. The CRC generated by the logic 216, 218 is fed into the logic 220, 222 for the next segment, and so on.

In the example shown, the multiplexer 230 receives an initial value and a CRC result. This multiplexer operates in a substantially similar manner as the multiplexer 160 in FIG. 8, to provide the initial value or a previous CRC result as a feedback input, depending on whether an end of packet (eop) signal is received at 234. In the apparatus 180, however, the previous CRC result is fed back to multiple XOR planes 216, 220, 224. A final CRC output is provided through the storage element 253 at the output 254 when the apparatus 180 is used for CRC encoding.

Embodiments of the present invention may be used in a number of applications, including but in no way limited to the following: 100 G Ethernet Media Access Control (MAC) applications, 40+G high-speed packet buses, 40 G POS (Packet Over SONET (Synchronous Optical NETwork)) processors, and POS framers.

In some embodiments, the gate count is reduced. Instead of L XOR planes for supporting a data packet of length L, a single plane is used in the apparatus 110 (FIG. 8), and fewer than L planes are used in the apparatus 180 (FIG. 11). Lower numbers of gates can be advantageous in terms of scaling, for instance.

Faster speeds may also or instead be provided. In the specific example of the apparatus 110 (FIG. 8), the length of the logical path is fixed, regardless of the width of the input 112. The length is fixed to the total length of an AND gate, $\log_2$ N XOR gates, and one additional XOR gate. The inherent speed of underlying transistors used to implement the XOR planes in the apparatus 180 (FIG. 11) may also be faster than required for the amount of processing needed.

What has been described is merely illustrative of the application of the principles of the invention. Other arrangements and methods can be implemented by those skilled in the art without departing from the spirit and scope of the present invention.

For example, other embodiments of the invention may include fewer, further, or different method operations or apparatus components than shown. Operations may be performed in a similar or different order, and components may also be interconnected in the same or different ways. At a receiver, for instance, a comparison component might be provided to compare a computed CRC with a CRC stored in a received packet or a predetermined "magic number" for the CRC type. A comparison component generally would not be provided in a transmit path at a transmitter that generates and sends CRC coded information.

In addition, although described herein primarily in terms of methods and apparatus, embodiments of the invention may be implemented in other forms, as instructions stored on a computer-readable medium, for example.

We claim:

1. A method comprising:
   selecting, from a plurality of different Cyclic Redundancy Check (CRC) coding modules, a CRC coding module for CRC coding a block of information;
   configuring a generic coder with the selected CRC coding module to perform CRC coding for the block of information based on the selected CRC coding module, the generic coder being configurable to perform CRC coding based on any of the plurality of different CRC coding modules;
   coding the block of information by multiplying an amount of information from the block of information in the generic coder based on the selected CRC coding module to produce a data product, multiplying a previously generated CRC code in the generic coder based on the selected CRC coding module to produce a CRC product, and combining the data product and the CRC product in an exclusive-OR operation to generate a CRC code.

2. The method of claim 1, wherein each CRC coding module comprises a data matrix specifying portions of the block of information to be included in the CRC coding, and a CRC matrix corresponding to a CRC generator polynomial.

3. The method of claim 2,
   wherein the plurality of CRC coding modules supports up to a maximum amount of information, from an information block, to be used to generate a CRC code during CRC coding, and up to a maximum size CRC generator polynomial,
   wherein the data matrix of each CRC coding module of the plurality of CRC coding modules has a size corresponding to the maximum amount of information, and
   wherein the CRC matrix of each CRC coding module of the plurality of CRC coding modules has a size corresponding to the maximum size CRC generator polynomial.

4. The method of claim 2,
   the multiplying an amount of information from the block of information in the generic coder based on the selected CRC coding module comprising multiplying the amount of information from the block of information with the data matrix of the selected CRC coding module to produce the data product;
   the multiplying a previously generated CRC code in the generic coder based on the selected CRC coding module comprising multiplying the previously generated CRC code with the CRC matrix of the selected CRC coding module to produce the CRC product.

5. The method of claim 1, wherein selecting comprises selecting a CRC coding module based on at least one of: an amount of information, from the information block, to be used to generate a CRC code, an alignment of the block of information within a data stream, and a particular CRC generator polynomial.

6. The method of claim 1, further comprising:
   receiving the plurality of CRC coding modules from software.

7. The method of claim 1, further comprising:
   segmenting the block of information into a plurality of segments having respective lengths,
   wherein selecting comprises selecting a respective CRC coding module for coding the plurality of segments, and wherein configuring the generic coder comprises configuring respective generic coders to perform CRC coding for the plurality of segments based on the selected CRC coding modules.

8. An apparatus comprising:
   a selector operable to select, from a plurality of different Cyclic Redundancy Check (CRC) coding modules, a CRC coding module for CRC coding a block of information; and
   a generic coder operatively coupled to the selector and configurable to perform CRC coding based on any of the plurality of different CRC coding modules, the generic coder being configured by the selected CRC coding module to perform CRC coding for the block of information based on the selected CRC coding module,
   the generic coder comprising:
   a data multiplier configurable to multiply an amount of information from the block of information based on the selected CRC coding module to produce a data product;
   a CRC multiplier configurable to multiply a previously generated CRC code with the CRC matrix of the selected CRC coding module to produce a CRC product; and
   an exclusive-OR gate, operatively coupled to the data multiplier and to the CRC multiplier, to combine the data product and the CRC product to generate a CRC code.

9. The apparatus of claim 8, wherein each CRC coding module comprises a data matrix specifying portions of the block of information to be included in the CRC coding, and a CRC matrix corresponding to a CRC generator polynomial.

10. The apparatus of claim 9,
    the data multiplier being configurable to multiply the amount of information from the block of information with the data matrix of the selected CRC coding module to produce the data product;
    the CRC multiplier being configurable to multiply the previously generated CRC code with the CRC matrix of the selected CRC coding module to produce the CRC product.

11. The apparatus of claim 10, wherein the data multiplier comprises a pipelined structure.

12. The apparatus of claim 8, wherein the selector selects a CRC coding module based on at least one of: an amount of information, from the information block, to be used to generate a CRC code, an alignment of the block of information within a data stream, and a particular CRC generator polynomial.

13. The apparatus of claim 8, further comprising:
    a memory, operatively coupled to the selector, for storing the plurality of CRC coding modules.

14. The apparatus of claim 8, wherein the generic coder is one of a plurality of generic coders operatively coupled to the selector, the apparatus further comprising:
    a segmentor operatively coupled to the selector and to each generic coder of the plurality of generic coders, the segmentor being operable to segment the block of information into a plurality of segments having respective lengths,
    wherein the selector is further operable to select a respective CRC coding module for coding the plurality of segments, and wherein the plurality of generic coders are respectively configured by the selected CRC coding modules to perform CRC coding for the plurality of segments based on the selected CRC coding modules.

* * * * *